United States Patent
Jung et al.

(10) Patent No.: US 11,858,264 B2
(45) Date of Patent: Jan. 2, 2024

(54) APPARATUS FOR DISPENSING DROPLET AND METHOD FOR DISPENSING DROPLET

(71) Applicant: SEMES CO., LTD, Cheonan-si (KR)

(72) Inventors: Yeonsu Jung, Hwaseong-si (KR); Yeonchul Song, Seoul (KR); Myeongjun Lim, Hwaseong-si (KR); Chulwoo Kim, Cheonan-si (KR)

(73) Assignee: SEMES CO., LTD, Cheonan-si (KR)

( * ) Notice: Subject to any disclaimer, the term of this patent is extended or adjusted under 35 U.S.C. 154(b) by 103 days.

(21) Appl. No.: 17/391,383

(22) Filed: Aug. 2, 2021

(65) Prior Publication Data

US 2022/0032611 A1    Feb. 3, 2022

(30) Foreign Application Priority Data

Aug. 3, 2020  (KR) .......................... 10-2020-0096882

(51) Int. Cl.
*B41J 2/045*   (2006.01)
*H10K 71/13*   (2023.01)
*B41J 11/00*   (2006.01)

(52) U.S. Cl.
CPC ....... *B41J 2/04535* (2013.01); *B41J 2/04581* (2013.01); *B41J 11/0085* (2013.01); *H10K 71/135* (2023.02); *B41J 2202/09* (2013.01)

(58) Field of Classification Search
None
See application file for complete search history.

(56) References Cited

U.S. PATENT DOCUMENTS

| | | | |
|---|---|---|---|
| 2010/0104740 A1* | 4/2010 | Shinohara | B41J 19/142 222/1 |
| 2010/0311298 A1* | 12/2010 | Suzuki | H10K 71/135 427/256 |
| 2011/0032293 A1* | 2/2011 | Yamamoto | B41J 2/2139 347/10 |
| 2012/0309252 A1* | 12/2012 | Takeuchi | H10K 71/135 445/24 |
| 2017/0301740 A1* | 10/2017 | Goto | H10K 59/35 |
| 2018/0233707 A1* | 8/2018 | Mine | H01L 21/67173 |

* cited by examiner

*Primary Examiner* — Shelby L Fidler
(74) *Attorney, Agent, or Firm* — DALY, CROWLEY, MOFFORD & DURKEE, LLP

(57) ABSTRACT

An apparatus for dispensing droplet may include a droplet discharging member, a stage and a control member. The droplet discharging member may include a plurality of nozzles arranged in a first direction by a constant interval. The stage may receive a substrate including a plurality of regions for forming a plurality of pixels of a same size disposed in the first direction and a second direction substantially perpendicular to the first direction. The control member may control the droplet discharging member such that amounts of droplets may be substantially identical in the regions of the substrate for the pixels if the numbers of the nozzles of the droplet discharging member with respect to sides of the regions of the substrate for the pixels are different in the first direction. The control member may identify patterns of discharged droplets in the regions of the substrate for the pixels and adjusts the amounts of the droplets form the nozzles of the droplet discharging member by controlling operation of each of nozzles of the droplet discharging member.

14 Claims, 2 Drawing Sheets

APPARATUS FOR DISPENSING DROPLET AND METHOD FOR DISPENSING DROPLET

TECHNICAL FIELD

The invention relates to an apparatus for dispensing droplet and a method of dispensing droplet. More particularly, the invention relates to an apparatus for dispensing droplet capable of discharging onto each of pixel regions of a substrate using a droplet discharging member such as an ink jet head, and a method of dispensing droplet using the apparatus.

BACKGROUND OF THE INVENTION

In manufacturing processes for a display device such as an organic electro-luminance (EL) device, a droplet discharging process can be performed using a droplet discharging member such as an ink jet head in order to discharge droplets onto pixel regions of a substrate, respectively.

In the process of discharging the droplets onto the substrate, the amount of the droplets provided onto the regions of the substrate are identical because the process of discharging the droplets may be determined as fail if the amount of the droplets provided onto the regions of the substrate are different, respectively.

The droplet discharging member such as the ink jet head may have a configuration in which a plurality of nozzles are arranged along a first direction by constant intervals. In addition, a plurality of pixels having the same sizes may be formed on the substrate such that the plurality of pixels may be disposed in parallel along a second direction perpendicular to the first direction.

In this case, the numbers of the nozzles arranged in the first direction can be different with respect to sides of the plurality of pixels. For example, three nozzles may be arranged relative to one side of the pixel in a first row of the pixels disposed along the first direction whereas four nozzles may be arranged relative to one side of the pixel in a second row of the pixels disposed in the first direction.

As such, if the numbers of the nozzles relative to the pixels are different along the first direction, the amounts of the droplets discharged onto the pixels may be frequently different while preforming the conventional process of dispensing droplet on the substrate.

DISCLOSURE OF THE INVENTION

Problems to be Solved

It is one object of the invention to provide an apparatus for dispensing droplet in which amounts of droplets provided onto a substrate may be substantially identical even though the numbers of nozzles relative to sides of pixels are different along a first direction.

It is another object of the invention to provide a method of dispensing droplet in which the amounts of droplets provided onto the substrate may be substantially identical even though the numbers of nozzles relative to the sides of pixels are different along the first direction.

Solutions for Problems to be Solved

To achieve the above objects of the invention, example embodiments of the invention provide an apparatus for dispensing droplet comprising a droplet discharging member, a stage and a control member. The droplet discharging member may include a plurality of nozzles arranged in a first direction by a constant interval. The stage may receive a substrate including a plurality of regions for forming a plurality of pixels of a same size disposed in the first direction and a second direction substantially perpendicular to the first direction. The control member may control the droplet discharging member such that amounts of droplets may be substantially identical in the regions of the substrate for the pixels if the numbers of the nozzles of the droplet discharging member with respect to sides of the regions of the substrate for the pixels are different in the first direction. The control member may identify patterns of discharged droplets in the regions of the substrate for the pixels and adjusts the amounts of the droplets form the nozzles of the droplet discharging member by controlling operation of each of nozzles of the droplet discharging member.

In example embodiments, the control member may control the droplet discharging member such that the amounts of the droplets may be substantially identical in the regions of the substrate for the pixels if the patterns of the discharged droplets in the regions of the substrate are substantially different.

In example embodiments, the control member may determine whether each of the nozzles of the droplet discharging member may discharge the droplets or not such that the amounts of the droplets may be substantially identical in the regions of the substrate for the pixels if the patterns of the discharged droplets in the regions of the substrate are substantially different.

In example embodiments, the control member may control the droplet discharging member based on the minimum amount of the discharged droplets in the regions of the substrate for the pixels such that the amounts of the droplets may be substantially identical in the regions of the substrate for the pixels.

In example embodiments, each of the pixels may have a rectangular structure including one side having a length of m in the first direction and another side having a length of n in the second direction such that the rectangular structure has a size of m×n To achieve the above objects of the invention, some example embodiments of the invention provide an apparatus for dispensing droplet comprising a droplet discharging member, a stage, a transferring member, and a control member. The droplet discharging member may include a plurality of nozzles arranged by a constant interval in a first direction. The stage may receive a substrate thereon wherein the substrate may include a plurality of regions for forming a plurality of pixels of a substantial same size disposed in the first direction and a second direction substantially perpendicular to the first direction, and each of the of the pixels may have a rectangular structure including one side having a length of m in the first direction and another side having a length of n in the second direction such that the rectangular structure has a size of m×n. The transferring member may transfer the substrate in the second direction. The control member may control the droplet discharging member such that amounts of droplets may be substantially identical in the regions of the substrate for the pixels if the numbers of the nozzles of the droplet discharging member with respect to sides of the regions of the substrate for the pixels are different in the first direction. The control member may identify patterns of discharged droplets in the regions of the substrate for the pixels and adjusts the amounts of the droplets form the nozzles of the droplet discharging member by controlling operation of each of nozzles of the droplet discharging member.

In example embodiments, the control member may control the droplet discharging member such that the amounts of the droplets may be substantially identical in the regions of the substrate for the pixels if the patterns of the discharged droplets in the regions of the substrate are substantially different.

In example embodiments, the control member may determine whether each of the nozzles of the droplet discharging member discharges the droplets or not such that the amounts of the droplets may be substantially identical in the regions of the substrate for the pixels if the patterns of the discharged droplets in the regions of the substrate are substantially different.

In example embodiments, the control member may control the droplet discharging member based on the minimum amount of the discharged droplets in the regions of the substrate for the pixels such that the amounts of the droplets may be substantially identical in the regions of the substrate for the pixels In example embodiments, the stage may include a floating stage for floating the substrate thereover.

In example embodiments, the stage may float the substrate by providing an air spray and a vacuum suction to a bottom face of the substrate.

In example embodiments, the transferring member may include at least one guide rail disposed in parallel with the stage adjacent to a side of the stage, a holding member for holding one end portion or two end portions of the substrate, and a driving member for applying a driving force to the holding member to move the holding member along with the substrate.

In example embodiments, the apparatus for dispensing droplet may additionally include a gantry for supporting the droplet discharging member wherein the gantry may be disposed across the stage in the first direction.

To achieve the above objects of the invention, other example embodiments of the invention provide a method of dispensing droplet. In the method, droplets may be discharged onto a plurality of regions of a substrate for forming a plurality of pixels of a same size disposed in the first direction and a second direction substantially perpendicular to the first direction by using a droplet discharging member including a plurality of nozzles arranged by a constant interval in a first direction. The droplet discharging member may be controlled such that amounts of droplets may be substantially identical in the regions of the substrate for the pixels if the numbers of the nozzles of the droplet discharging member with respect to sides of the regions of the substrate for the pixels are different in the first direction. The controlling of the droplet discharging member may be performed by using a control member which may identify patterns of discharged droplets in the regions of the substrate for the pixels and adjusts the amounts of the droplets form the nozzles of the droplet discharging member by controlling operation of each of nozzles of the droplet discharging member.

In example embodiments, the control member may control the droplet discharging member such that the amounts of the droplets may be substantially identical in the regions of the substrate for the pixels if the patterns of the discharged droplets in the regions of the substrate are substantially different.

In example embodiments, the control member may determine whether each of the nozzles of the droplet discharging member discharges the droplets or not such that the amounts of the droplets are substantially identical in the regions of the substrate for the pixels if the patterns of the discharged droplets in the regions of the substrate are substantially different.

In example embodiments, the control member may control the droplet discharging member based on the minimum amount of the discharged droplets in the regions of the substrate for the pixels such that the amounts of the droplets are substantially identical in the regions of the substrate for the pixels.

In example embodiments, each of the pixels may have a rectangular structure including one side having a length of m in the first direction and another side having a length of n in the second direction such that the rectangular structure has a size of m×n.

In example embodiments, the substrate may be transferred in a second direction perpendicular to the first direction when the droplets are discharged onto the substrate.

In example embodiments, the substrate may be transferred while floating the substrate over a stage for supporting the substrate.

Effect of the Invention

According to example embodiments of the invention, the apparatus for dispensing droplet may include the control member capable of adjusting the amounts of the droplets discharged from the droplet discharging member onto the substrate for the plurality of pixels such that the amounts of the discharged droplets may be substantially identical in the regions of the substrate for the plurality of pixels. Therefore, the failure of the process for discharging the droplets may be prevented and the pixels formed on the substrate may be uniform.

Further, the control member according to example embodiments of the invention may identify the patterns of the discharged droplets in the regions of the substrate for the pixels and may control the droplet discharging member such that the amounts of the discharged droplets may be substantially identical in the regions of the substrate for the pixels even though the distance between adjacent pixels are substantially different from the interval between adjacent nozzles of the droplet discharging member. Therefore, when the apparatus for dispensing droplet is used in processes for manufacturing a display device, the reliability of the display device may be improved.

DESCRIPTION OF EMBODIMENTS

Figure 1:
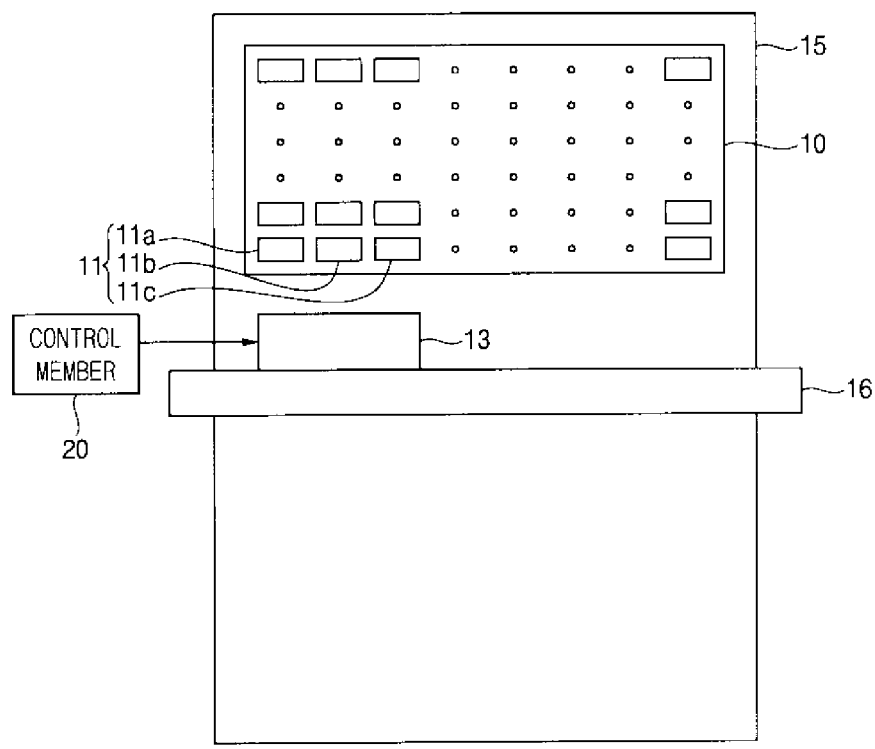
FIG. 1 is a schematic diagram illustrating an apparatus for dispensing droplet in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity. Like numerals refer to like elements throughout. It will be understood that, although the terms first, second, third etc. may be used herein to describe various elements, components, regions, layers and/or sections, these elements, components, regions, layers and/or sections should not be limited by these terms. The terminology used herein is for the purpose of describing particular embodiments only and is not intended to be limiting of the invention. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. These terms are only used to distinguish one element, component, region, layer or section from another region, layer or section.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the invention will be described in detail with reference to the accompanying drawings. Like elements or components can be indicated by like reference numerals throughout the drawings, and the repeated explanations of like elements or components may be omitted.

FIG. 1 is schematic diagram illustrating an apparatus for dispensing droplet in accordance with example embodiments of the invention.

Referring to FIG. 1, an apparatus for dispensing droplet (100) according to example embodiments of the invention may be configured to discharge droplets onto a substrate (10) in manufacturing processes for a display device such as an organic electroluminescence (EL) device, particularly to discharge the droplets onto the substrate (10) for forming a plurality of pixels (11) on the substrate (10).

In example embodiments of the invention, each of the plurality of pixels (11) may be formed to have the same size and the plurality of pixels (11) may be formed on the substrate (10) in a first direction and in a second direction perpendicular to the first direction.

Further, each of the plurality of pixels (11) may have a rectangular structure including one side having a length of m in the first direction and another side having a length of n in the second direction such that the rectangular structure may have a size of m×n.

The apparatus for dispensing droplet (100) according to example embodiments of the invention may include a droplet discharging member (13), a stage (15), a gantry (16), a control member (20), etc.

The stage (15) may receive and support the substrate (10) while providing the droplets onto the substrate (10) such that the stage (15) may have a size which may sufficiently receive the substrate (10) and may not affect the transference of the substrate (10).

In example embodiments of the invention, the plurality of pixels (11) having the same size may be formed on the substrate (10) placed on the stage (15) wherein the pixels (11) may be disposed on the substrate (10) in the first direction and the second direction.

The stage (15) may float the substrate (10) thereover while the droplets are discharged onto the substrate (10) to form the pixels (11), and thus the stage (15) may be a floating stage.

In particular, the stage (15) may be disposed in an area of the apparatus for dispensing droplet where the droplets are discharged such that the distance between the stage (15) and the substrate (10) floating over the stage (15) may be precisely adjusted.

Thus, the stage (15) may simultaneously provide an air spray and a vacuum suction toward a bottom face of the substrate (10) in order to precisely float the substrate (10) over the stage (15) by spraying the air and by providing the vacuum suction.

The droplet discharging member (13) may provide the droplets onto the substrate (10) located over the stage (15).

The droplet discharging member (13) may discharge the droplets onto the substrate (10) while transferring the substrate (10) along the stage (15), and may be fixed over the substrate (10) so as to downwardly provide the droplets onto the substrate (10) transferred over the stage (15).

In example embodiments of the invention, the droplet discharging member (13) may include a plurality of nozzles arranged in the first direction by constant intervals, and thus the droplet discharging member (13) may be the ink jet head capable of discharging the droplets onto the substrate (10) from a plurality of nozzles thereof.

The droplet discharging member (13) may additionally include a plurality of piezoelectric elements disposed adjacent to the plurality of nozzles, respectively. The number of the piezoelectric elements may be the same as the number of the nozzles. The nozzles may discharge the droplets onto the substrate (10) by the operations of the piezoelectric elements.

That is, each of the piezoelectric elements may operate to enable each of the nozzles to spray the droplets onto each of regions of the substrate (10).

Particularly, the amounts of the droplets provided from the nozzles may be adjusted by controlling voltages applied to the piezoelectric elements, respectively.

The gantry (16) may support the droplet discharging member (13) and may move along the stage (15) such that the droplet discharging member (13) may provide the droplets onto the substrate (10) transferred over the stage (15).

In example embodiments of the invention, the gantry (16) may be disposed across the stage (15) in the first direction, and also the droplet discharging member (13) may be moved along with the gantry (16) in the first direction so as to discharge the droplets onto the regions of the substrate (10).

In the process for discharging the droplets onto the substrate (10) using the apparatus for dispensing droplet (100) according to example embodiments of the invention, the droplets may be sprayed onto the substrate (10) from the nozzles of the droplet discharging member (13) while moving the substrate (10) positioned over the stage (15) along the second direction.

Figure 2:
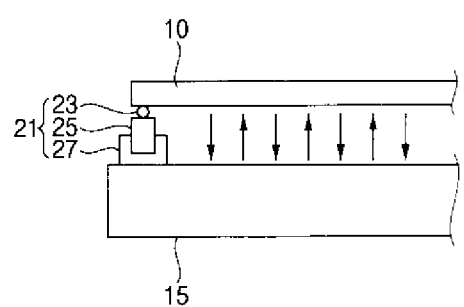
FIG. 2 is a diagram illustrating a transferring member of the apparatus for dispensing droplet in FIG. 1.

FIG. 2 is a diagram illustrating a transferring member of the apparatus for dispensing droplet shown in FIG. 1.

Referring to FIG. 2, the apparatus for dispensing droplet (100) may additionally include a transferring member (21) wherein the transferring member (21) may move the substrate (10) placed on or over the stage (15) along the second direction in the process for dispensing the droplets onto the substrate (10).

The transferring member (21) may include a holding member (23) capable of holding one end portion or two end portions of the substrate (10), a guide rail (27) being disposed in parallel with the stage (15) adjacent to one side of the stage (15), and a driving member (25) capable of applying a driving force to the holding member (23) to move the holding member (23) along with the substrate (10). Alternatively, two guide rails (27) may be disposed adjacent to both sides of the stage (15), respectively.

The holding member (23) may be disposed on the guide rail (27) such that the holding member (23) may be transferred along the guide rail (27) by the driving force applied from the driving member (25).

The holding member (23) may hold the one end portion or the two end portions of the substrate (10) through a vacuum suction. Alternatively, the holding member (23) may directly grip the one end portion or the two end portions of the substrate (10).

As described above, in the process for discharging the droplets onto the substrate (10) using the apparatus for dispensing droplet (100) according to example embodiments of the invention, the droplets may be discharged onto the substrate (10) from the droplet discharging member (13) coupled to the gantry (16) while transferring the substrate (10) positioned on or over the stage (15) such that the droplets may be provided onto the regions of the substrate (10), respectively, for forming the plurality of pixels (11).

Meanwhile, the amounts of the droplets may be different at the regions of the substrate (10) for the plurality of pixels (11) because the numbers of nozzles of the droplet discharging member (13) relative to the sides of the regions of the substrate (10) for the plurality of pixels (11) along the first direction.

Considering the above mentioned problem, the apparatus for dispensing droplet (100) according to example embodiments of the invention may include the control member (20) to control the droplet discharge member (13) so that the amounts of the droplets sprayed from the nozzles of the droplet discharge member (13) may be substantially identical at the regions of the substrate (10) for the pixels (11) while discharging the droplets onto the substrate (10) even though the numbers of nozzles of the droplet discharging member (13) with respect to the sides of the regions of the substrate (10) for the pixels (11) along the first direction.

Figure 3:
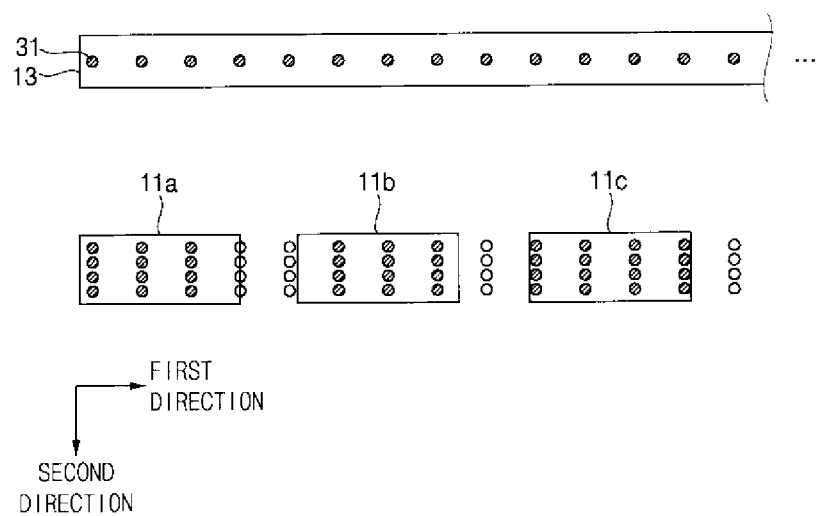
FIG. 3 is a diagram illustrating a method of adjusting amounts of droplets and patterns of discharged droplets in regions of a substrate for pixels using the apparatus for dispensing droplet in FIG. 1.

FIG. 3 is a diagram illustrating a method of adjusting the amounts of the droplets and the patterns of the discharged droplets in the regions of the substrate for the pixels using the apparatus for dispensing droplet in FIG. 1.

Referring to FIG. 3, the plurality of pixels (11) having the same size may be formed on the regions of the substrate along the first direction and the second direction such that the plurality of pixels (11), for example, a first pixel (11a), a second pixel (11b) and a third pixel (11c) may be formed on the substrate in the first direction.

In the example embodiments of the invention, each of the plurality of pixels (11) may include one side having a length of m along the first direction and another side having a length of n along the second direction such that each of the plurality of pixels (11) may have a size of m×n.

In the process for discharging the droplets onto the substrate (10) using the apparatus for dispensing droplet (100) according to example embodiments of the invention, the droplets may be discharged onto the substrate (10) from the droplet discharging member (13) including the plurality of nozzles (31) arranged in the first direction while transferring the substrate (10) including the plurality of regions for the plurality of pixels (11) having the first pixel (11a), the second pixel (11b) and the third pixel (11c) along the second direction. Thus, patterns of discharged droplets may be formed at the regions of the substrate (10) for the plurality of pixels (11) having the first pixel (11a), the second pixel (11b) and the third pixel (11c).

As described above, the numbers of the nozzles (31) of the droplet discharging member (13) may be different with respect to the sides of the plurality of pixels (11) along the first direction because the distance between adjacent pixels (11) are substantially different from the interval between adjacent nozzles (31) of the droplet discharging member (13).

For example, as shown in FIG. 3, in the patterns of the discharged droplets in the first pixel (11a), the second pixel (11b) and the third pixel (11c), the first pixel (11a) may include twelve patterns of the discharged droplets therein in addition to four patterns of the discharged droplets at a right boundary thereof. Additionally, the second pixel (11b) may include twelve patterns of the discharged droplets therein and the third pixel (11c) may include sixteen patterns of the discharged droplets therein. Moreover, four patterns of the discharged droplets may be formed between adjacent pixels.

In this case, the first pixel (11a) and the third pixel (11c) may be determined as fails if the process for discharging the droplets is decided based on the patterns in the second pixel (11b).

Considering the above problems, in the apparatus for dispensing droplet (100) according to example embodiments of the invention, the control member (20) may control the droplet discharging member (13) based on the patterns of the discharged droplets such that the droplet discharge member (13) may adjust the amounts of the droplets in the regions of the substrate (10) for the pixels (11). As a result, the amounts of the droplets may be substantially identical at the pixels (11) formed on the substrate (10) even though the numbers of the nozzles (31) of the droplet discharging member (13) may be different relative to the sides of the pixels (11) along the first direction.

In other words, the apparatus for dispensing droplet (100) according to example embodiments of the invention may provide the droplets onto the substrate (10) such that all of the first pixel (11a), the second pixel (11b) and the third pixel (11c) may have twelve patterns therein.

Particularly, the control member (20) may control the droplet discharging member (13) such that the nozzles (31) of the droplet discharging member (13) may not spray the droplets at the right boundary of the first pixel (11a) to form twelve patterns in the first pixel (11a), may spray the droplets to form twelve patterns in the second pixel (11b), and may spray the droplets to form twelve patterns in the third pixel (11c).

As such, the control member (20) may adjust the amounts of the droplets provided from the nozzles (31) onto the substrate (10) by controlling the droplet discharging member (13) so that the amounts of the droplets may be substantially identical in the regions of the substrate (10) for the pixels (11) even though the patterns of the discharged droplets are substantially different in the regions of the substrate (10).

In this case, the control member (20) may control the droplet discharging member (13) such that the discharges of the droplets from the nozzles (31) may be different so as to provide the droplets onto the regions of the substrate (10) for the pixels (11) with the substantially same amount.

That is, the control member (20) may adjust the nozzles (31) of the droplet discharging member (13) so that each of the pixels (11) may have substantially the same patterns of the discharged droplet although the distance between adjacent pixels (11) are substantially different from the interval between adjacent nozzles (31) of the droplet discharging member (13).

In particular, the control member (20) may determine whether each of the nozzles (31) may spray the droplets onto the substrate (10) or not while the nozzles (31) of the droplet discharging member (13) moves over the substrate (10). Thus, the control member (20) may adjust the amounts of the droplets in the regions of the substrate (10) for the pixels (11) although the patterns of the discharged droplets are substantially different in the regions of the substrate (10) for the pixels (11).

In this case, the control member (20) may control the operations of the piezoelectric elements by adjusting the voltage applied to the piezoelectric elements such that the piezoelectric elements may independently control the operations of the nozzles (31).

Further, the control member (20) may control the nozzles (31) based on the region of the substrate (10) on which the minimum amount of the droplets is provided from the nozzles (31) such that the amounts of the discharged droplets are substantially identical in the regions of the substrate (10) for the pixels (11).

For example, as shown in FIG. 3, when the second pixel (11b) has twelve patterns of the discharged droplets, the control member (20) may adjust the amounts of the discharged droplets in the first pixel (11a) and the third pixel (11c) based on the amount of the discharged droplets in the second pixel (11b) by controlling the nozzles (31) of the droplet discharging member (13) so that each of the first pixel (11a) and the third pixel (11c) may also have twelve patterns of the discharged droplets.

In this case, the patterns of the discharged droplets may vary in the pixels (11) by controlling the nozzles (31) of the droplet discharging member (13) with the control member (20).

Moreover, the control member (20) may adjust the amounts of the droplets discharged from the droplet discharging member (13) by controlling the speed of the substrate (10) transferred over the stage (15) and the discharge frequencies for the spraying of the droplets from the nozzles (31) besides the nozzles (31) of the droplet discharging member (13) such that the amounts of the discharged droplets may be more accurately identical in the regions of the substrate (10) for the pixels (11) although the patterns of the discharged droplets are substantially different in the regions of the substrate (10) for the pixels (11).

According to example embodiments of the invention, the apparatus for dispensing droplet (100) may include the control member (20) capable of adjusting the amounts of the droplets discharged from the droplet discharging member (13) onto the substrate (10) for the plurality of pixels (11) such that the amounts of the discharged droplets may be substantially identical in the regions of the substrate (10) for the plurality of pixels (11) even though the distance between adjacent pixels (11) are substantially different from the interval between adjacent nozzles (31) of the droplet discharging member (13). Therefore, the failure of the process for discharging the droplets may be prevented and the pixels (11) formed on the substrate (10) may be uniform.

Further, the control member (20) according to example embodiments of the invention may identify the patterns of the discharged droplets in the regions of the substrate (10) for the pixels (11) and may control the droplet discharging member (13) so that the amounts of the discharged droplets may be substantially identical in the regions of the substrate (10) for the pixels (11) although the numbers of nozzles of the droplet discharging member (13) with respect to the sides of the regions of the substrate (10) for the pixels (11) along the first direction.

INDUSTRIAL APPLICABILITY

According to example embodiments of the invention, the apparatus for dispending droplet may be advantageously used in the processes for manufacturing a display device such as an organic electroluminescent (EL) device because the apparatus for dispending droplet may uniformly provide droplets onto a substrate for forming pixels of the display device.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

DESCRIPTION OF REFERENCE NUMERALS

10: substrate
11: pixels
13: droplet discharging member
15: stage
16: gantry
20: control member
21: transferring member
31: nozzles
100: apparatus for dispensing droplet

The invention claimed is:
1. An apparatus for dispensing droplet comprising:
a droplet discharging member including a plurality of nozzles arranged in a first direction by a constant interval;
a stage for receiving a substrate thereon wherein the substrate includes a plurality of regions for forming a plurality of pixels of a same size disposed in the first direction and a second direction substantially perpendicular to the first direction; and
a control member for controlling the droplet discharging member such that amounts of droplets are substantially identical in the regions of the substrate for the pixels if the numbers of the nozzles of the droplet discharging member with respect to sides of the regions of the substrate for the pixels are different in the first direction,
wherein the control member identifies patterns of discharged droplets in the regions of the substrate for the pixels and adjusts the amounts of the droplets from the nozzles of the droplet discharging member based on a minimum amount of the discharged droplets in the regions of the substrate for the pixels by controlling operation of each of nozzles of the droplet discharging member such that the amounts of the droplets are substantially identical in the regions of the substrate for the pixels, and wherein the control member controls the droplet discharging member such that the amounts of the droplets are substantially identical in the regions of the substrate for the pixels if the patterns of the discharged droplets in the regions of the substrate are substantially different.

2. The apparatus for dispensing droplet of claim 1, wherein the control member determines whether each of the nozzles of the droplet discharging member discharges the droplets or not such that the amounts of the droplets are substantially identical in the regions of the substrate for the pixels if the patterns of the discharged droplets in the regions of the substrate are substantially different.

3. The apparatus for dispensing droplet of claim 1, wherein each of the pixels has a rectangular structure including one side having a length of m in the first direction and another side having a length of n in the second direction such that the rectangular structure has a size of m×n.

4. An apparatus for dispensing droplet comprising:
a droplet discharging member including a plurality of nozzles arranged by a constant interval in a first direction;
a stage for receiving a substrate thereon wherein the substrate includes a plurality of regions for forming a plurality of pixels of a same size disposed in the first direction and a second direction substantially perpendicular to the first direction, and each of the of the pixels has a rectangular structure including one side having a length of m in the first direction and another side having a length of n in the second direction such that the rectangular structure has a size of m×n;
a transferring member for transferring the substrate in the second direction; and
a control member for controlling the droplet discharging member such that amounts of droplets are substantially identical in the regions of the substrate for the pixels if the numbers of the nozzles of the droplet discharging member with respect to sides of the regions of the substrate for the pixels are different in the first direction,
wherein the control member identifies patterns of discharged droplets in the regions of the substrate for the pixels and adjusts the amounts of the droplets from the nozzles of the droplet discharging member based on a minimum amount of the discharged droplets in the regions of the substrate for the pixels by controlling operation of each of nozzles of the droplet discharging member, such that the amounts of the droplets are substantially identical in the regions of the substrate for the pixels, and
wherein the control member controls the droplet discharging member such that the amounts of the droplets are substantially identical in the regions of the substrate for the pixels if the patterns of the discharged droplets in the regions of the substrate are substantially different.

5. The apparatus for dispensing droplet of claim 4, wherein the control member determines whether each of the nozzles of the droplet discharging member discharges the droplets or not such that the amounts of the droplets are substantially identical in the regions of the substrate for the pixels if the patterns of the discharged droplets in the regions of the substrate are substantially different.

6. The apparatus for dispensing droplet of claim 4, wherein the stage includes a floating stage for floating the substrate thereover.

7. The apparatus for dispensing droplet of claim 6, wherein the stage floats the substrate by providing an air spray and a vacuum suction to a bottom face of the substrate.

8. The apparatus for dispensing droplet of claim 6, further comprising a gantry for supporting the droplet discharging member wherein the gantry is disposed across the stage in the first direction.

9. The apparatus for dispensing droplet of claim 4, wherein the transferring member includes at least one guide rail disposed in parallel with the stage adjacent to a side of the stage, a holding member for holding one end portion or two end portions of the substrate, and a driving member for applying a driving force to the holding member to move the holding member along with the substrate.

10. A method of dispensing droplet comprising:
discharging droplets onto a plurality of regions of a substrate for forming a plurality of pixels of a same size disposed in the first direction and a second direction substantially perpendicular to the first direction by using a droplet discharging member including a plurality of nozzles arranged by a constant interval in a first direction; and
controlling the droplet discharging member such that amounts of droplets are substantially identical in the regions of the substrate for the pixels if the numbers of the nozzles of the droplet discharging member with respect to sides of the regions of the substrate for the pixels are different in the first direction,
wherein controlling of the droplet discharging member is performed by using a control member which identifies patterns of discharged droplets in the regions of the substrate for the pixels and adjusts the amounts of the droplets from the nozzles of the droplet discharging member based on a minimum amount of the discharged droplets in the regions of the substrate for the pixels by controlling operation of each of nozzles of the droplet discharging member such that the amounts of the droplets are substantially identical in the regions of the substrate for the pixels, and
wherein the control member controls the droplet discharging member such that the amounts of the droplets are substantially identical in the regions of the substrate for the pixels if the patterns of the discharged droplets in the regions of the substrate are substantially different.

11. The method of dispensing droplet of claim 10, wherein the control member determines whether each of the nozzles of the droplet discharging member discharges the droplets or not such that the amounts of the droplets are substantially identical in the regions of the substrate for the pixels if the patterns of the discharged droplets in the regions of the substrate are substantially different.

12. The method of dispensing droplet of claim 10, wherein each of the pixels has a rectangular structure including one side having a length of m in the first direction and another side having a length of n in the second direction such that the rectangular structure has a size of m×n.

13. The method of dispensing droplet of claim 10, wherein the substrate is transferred in a second direction perpendicular to the first direction when the droplets are discharged onto the substrate.

14. The method of dispensing droplet of claim 13, wherein the substrate is transferred while floating the substrate over a stage for supporting the substrate.

* * * * *